(12) United States Patent
Petroski

(10) Patent No.: US 7,355,856 B2
(45) Date of Patent: Apr. 8, 2008

(54) METHOD AND APPARATUS FOR INCREASING NATURAL CONVECTION EFFICIENCY IN LONG HEAT SINKS

(75) Inventor: James T. Petroski, Parma, OH (US)

(73) Assignee: Lumination LLC, Valley View, OH (US)

( * ) Notice: Subject to any disclaimer, the term of this patent is extended or adjusted under 35 U.S.C. 154(b) by 0 days.

(21) Appl. No.: 11/487,894

(22) Filed: Jul. 17, 2006

(65) Prior Publication Data

US 2006/0250769 A1    Nov. 9, 2006

Related U.S. Application Data

(63) Continuation of application No. 10/931,506, filed on Sep. 1, 2004, now Pat. No. 7,096,678.

(51) Int. Cl.
*H05K 7/20*    (2006.01)
*H01L 23/367*    (2006.01)

(52) U.S. Cl. ............. 361/710; 361/709; 361/697; 257/706; 257/707; 257/722

(58) Field of Classification Search .............. 361/710, 361/709, 697; 257/706, 707, 722
See application file for complete search history.

(56) References Cited

U.S. PATENT DOCUMENTS

| | | | |
|---|---|---|---|
| 4,390,352 A | 6/1983 | Grun | |
| 4,494,380 A | 1/1985 | Cross | |
| 4,646,528 A | 3/1987 | Marcade et al. | |
| 4,729,076 A * | 3/1988 | Masami et al. | 362/235 |
| 4,764,193 A | 8/1988 | Clawson | |
| 5,433,080 A | 7/1995 | Boeckel | |
| 5,857,767 A | 1/1999 | Hochstein | |
| 6,255,786 B1 | 7/2001 | Yen | |
| 6,269,864 B1 | 8/2001 | Kabadi | |
| 6,371,200 B1 | 4/2002 | Eaton | |
| 6,390,188 B1 | 5/2002 | Chen | |
| 6,472,823 B2 | 10/2002 | Yen | |
| 6,517,218 B2 * | 2/2003 | Hochstein | 362/294 |
| 6,568,833 B2 * | 5/2003 | Worgan et al. | 362/247 |
| 6,799,864 B2 | 10/2004 | Bohler et al. | |
| 6,799,870 B2 * | 10/2004 | Lin | 362/294 |
| 7,096,678 B2 * | 8/2006 | Petroski | 62/3.2 |
| 2002/0109970 A1 | 8/2002 | Yang | |

FOREIGN PATENT DOCUMENTS

| | | | |
|---|---|---|---|
| FR | 2512601 A * | 3/1983 | |
| GB | 2 107 130 | 4/1983 | |
| JP | 09145246 A | 6/1997 | |

OTHER PUBLICATIONS

International Search Report from PCT/US2005/30732.

* cited by examiner

*Primary Examiner*—Anatoly Vortman
(74) *Attorney, Agent, or Firm*—Fay Sharpe LLP

(57) ABSTRACT

An electrical apparatus that is cooled via natural convection includes an electrical component, a vertical heat dissipation surface in thermal communication with the electrical component, and a diverter extending from the heat dissipation surface. The diverter disrupts vertical airflow over the heat dissipation surface.

20 Claims, 4 Drawing Sheets

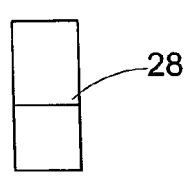 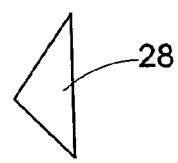 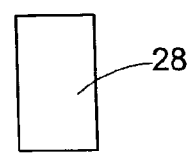 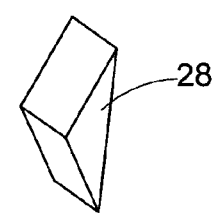
FIG. 6A    FIG. 6B    FIG. 6C    FIG. 6D
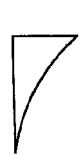  
FIG. 7A    FIG. 7B    FIG. 7C
  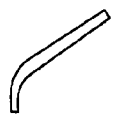
FIG. 7D    FIG. 7E    FIG. 7F
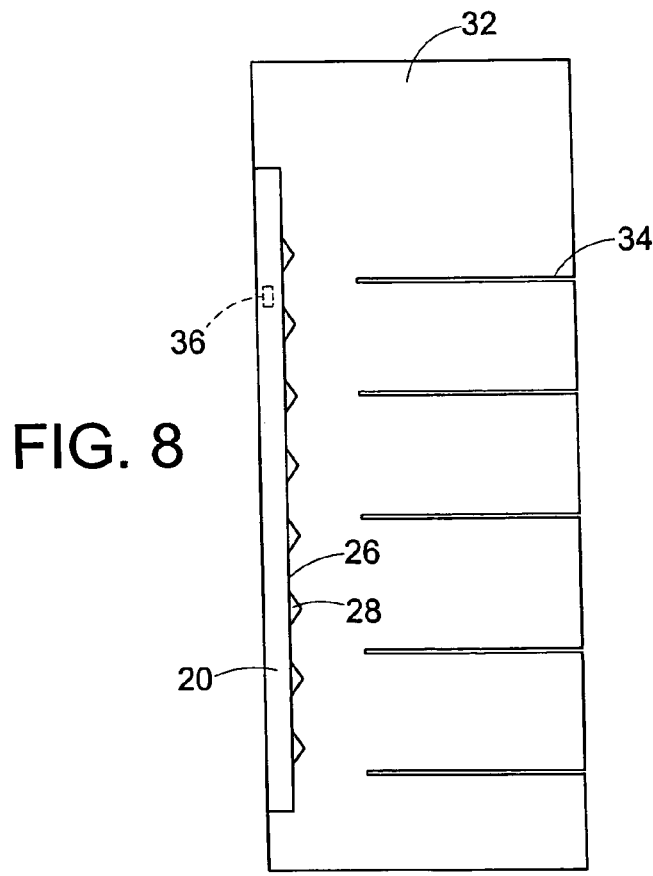
FIG. 8

METHOD AND APPARATUS FOR INCREASING NATURAL CONVECTION EFFICIENCY IN LONG HEAT SINKS

This application is a continuation of U.S. application Ser. No. 10/931,506, filed Sep. 1, 2004, now U.S. Pat. No. 7,096,678 the disclosure of which is incorporated herein by reference.

BACKGROUND OF THE INVENTION

Heat sinks are used to cool electrical devices, such as chips, diodes, and the like. Air, or some other fluid, flows over heat dissipation surfaces of the heat sink to cool the heat sink, and thus the electrical device. The heat transfer is mainly by way of convection.

Generally, natural convection is the cooling of a vertical hot surface in a large quiescent body of air. Lower-density air next to the vertical hot surface moves upward because of the buoyant force of higher-density cooler air farther away from the vertical surface. Movement of the air adjacent the vertical surface increases in velocity from zero at the vertical surface to a maximum velocity at a distance from the vertical surface and then decreases back to a velocity of zero as ambient surrounding conditions are reached. The temperature of the moving air decreases from the heated surface temperature to the ambient air temperature. As the temperature of the moving air approaches the ambient, the velocity at which the air moves approaches zero. No heat flows, by conduction or convection, where the velocity and temperature gradients equal zero, thus this outer edge is referred to as the boundary layer.

Forced convection, where air is blown across a heated surface, results in a maximum air velocity at the outer edge of the boundary layer. The difference in the velocity profile and the higher velocities provide more air near the heated surface and very thin boundary layers. Natural convection forces are present; however, the natural convection forces are negligible.

Forced convection may remove more heat than natural convection, but forced convection requires a device to move the air. In small electronic packages or where it is desirable to minimize the amount of energy expended to cool the electronic components, forced convection may be undesirable.

In free or natural convection, a tall heat sink tends to mix air inadequately with the surroundings resulting in the local ambient temperature around the heat sink to be hotter at the top of the heat sink as compared to the bottom of the heat sink, especially in laminar flow regimes. With reference to FIG. 1, a long, tall vertically-oriented heat sink 10 creates natural convection by heating the air around heat sink fins 12. This air then rises, creating an airflow that removes heat from the heat sink 10. For the section near the top of the heat sink, the local ambient air temperature is warmer than the air entering at the bottom of the heat sink 10. Although the heat sink is removing heat generated by electrical components 14 (FIG. 2) by natural convection, this local temperature rise near the top of the heat sink can have adverse effects on cooling, thus resulting in adverse effects on the electronic components mounted near the top of the heat sink.

SUMMARY OF THE INVENTION

An electrical apparatus that is cooled via natural convection includes an electrical component, a vertical heat dissipation surface in thermal communication with the electrical component, and a diverter extending from the heat dissipation surface. The diverter disrupts laminar vertical airflow over the heat dissipation surface.

A method for cooling an electrical component using natural convection comprises the following steps: attaching an electrical component to a vertically oriented heat sink having a heat dissipation surface, introducing power into the electrical component such that the electrical component heats the heat sink generating upward laminar flow via natural convection over the heat dissipating surface, and disrupting the upward laminar flow over the heat dissipating surface.

A heat sink for an electrical component includes a heat sink body and a diverter. The heat sink body is adapted to have an associated electrical component mounted to the heat sink body, and the diverter is in thermal communication with the heat sink body. The diverter includes a first curved surface shaped to direct airflow toward the heat sink body and a second curved surface shaped to direct airflow away from the heat sink body.

BRIEF DESCRIPTION OF THE DRAWINGS

FIGS. 6A-6D are views of the diverter of FIG. 5.

FIG. 7A-7F are some alternative embodiments of diverters.

FIG. 8 is a schematic view of a refrigerated compartment having a heat sink.

DETAILED DESCRIPTION

Figure 1:
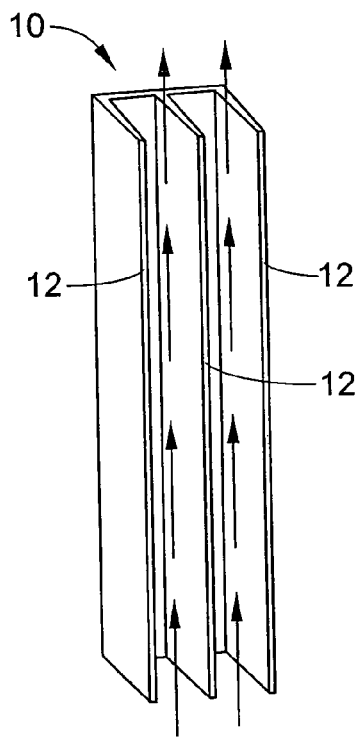
FIG. 1 is a rear perspective view of a known heat sink in thermal communication with an electrical component.
Figure 2:
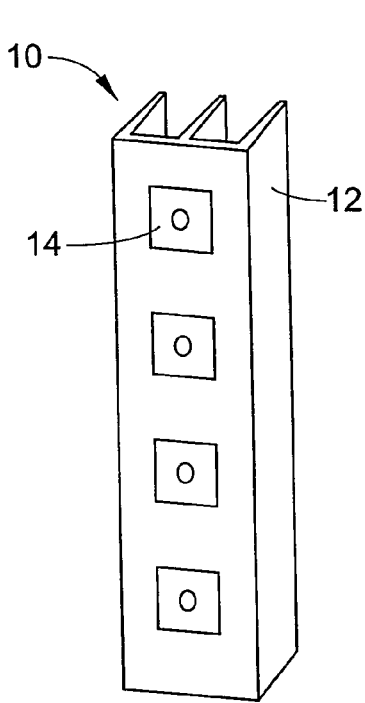
FIG. 2 is a front perspective view of the heat sink of FIG. 1 showing the electrical components mounted to the heat sink.
Figure 4:
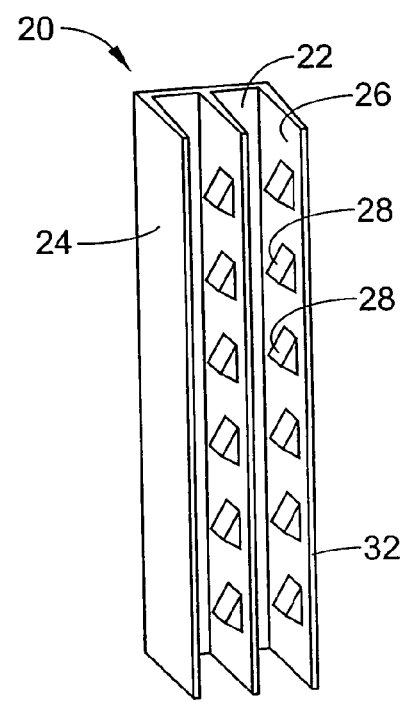
FIG. 4 is a rear perspective view of a heat sink including a plurality of diverters.
Figure 3:
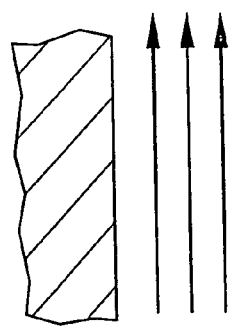
FIG. 3 is a close-up schematic view of airflow over a fin of the heat sink of FIG. 1.

With reference to FIG. 4, a heat sink 20 for cooling electrical components, for example LEDs, (not shown but similar to components 14 in FIG. 2) is provided. The heat sink 20 generally includes a base 22 having a plurality of fins 24 extending from the base. Electrical components can mount to the base on a mounting surface (not shown) that is opposite the fins 24. Alternatively, the electrical components can mount to other surfaces that are in thermal communication with a heat dissipation surface 26. In this embodiment, the fins 24 along with the rear side of the base 22 provide the heat dissipation surface 26 over which air flows to remove heat from the heat sink 20.

In this particular embodiment, a long, vertically oriented heat sink 22 is provided to generate upward laminar flow via natural convection. Although not to be bound by theory, computer modeling has indicated that a long heat sink, i.e. a heat sink where the vertical dimension is about ten times the remaining two dimensions, is capable of generating upward laminar airflow via natural convection on the order of one meter per second when appropriate heating is applied. Nevertheless, not only are heat sinks where the vertical dimension is ten times the remaining two dimensions contemplated, shorter heat sinks, for example where the vertical dimension is about five times or even two times the remaining two dimensions, may achieve adequate results.

A plurality of diverters 28 mount to the heat dissipation surface 26 of the heat sink 20. The diverters 28 are vertically spaced from one another. The diverters 28 can also be horizontally spaced from one another. The mounting surface 26 can include designated mounting locations 32 where the diverters 28 can attach to the heat dissipating surface 26. The mounting locations 28 can include holes that receive fasteners, or can simply include a marked location. According to the embodiment having mounting locations, the diverters 28 can be selectively removable from the heat dissipating surface 26.

Figure 5:
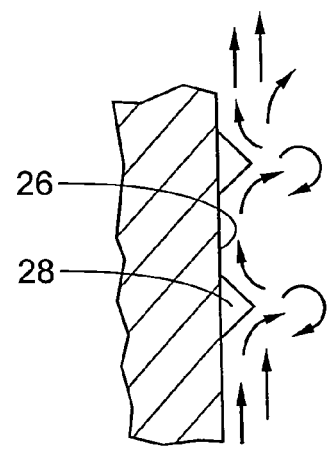
FIG. 5 is a side view of a heat dissipation surface of a heat sink having diverters mounted on the surface.

With reference to FIG. 6, the diverters 28 are shown as ramps. With reference to FIG. 5, the diverters 28 disrupt the upward laminar flow of air across the heat dissipation surface 26 resulting in turbulent airflow adjacent the diverter. The turbulent airflow reduces the overall temperature of the ambient air adjacent the heat sink by mixing in cooler airflow located away from the heat sink. The diverter 28 can be shaped to create turbulent airflow that escapes the boundary layer of laminar flow generated by natural convection. Accordingly, heat can be dissipated across the laminar flow bounder layer and mixing the cooler surrounding air with the hotter air adjacent the heat dissipation surface 26. The diverters can also disrupt generally upward flow in the turbulent regime and the transitional regime. The diverters disrupt all three kinds of flow moving air outside of the boundary layer to promote heat transfer across the boundary layer.

With reference to FIG. 7 alternative configurations of diverters are shown. In some embodiments, the diverter includes a curved upstream surface. In other embodiments, the diverter comprises a thin plate like member. Although many different configurations are disclosed in the figures, the diverters can take any configuration that adequately disrupts the vertical flow.

With reference to FIG. 8, the heat sink 20 is situated in a refrigerated compartment 32. The heat sink 20 is long and narrow, similar to those described above, and typically mounts to a mullion of the refrigerated compartment 32. The refrigerated compartment 32 can include a refrigerator, a freezer, or other compartment typically found in supermarkets, convenience stores and the like. Lights 36 are used to illuminate the item stored on the shelves 34. The heat sink 20 includes a heat dissipation surface 26 and diverters 28. The diverters 28 can also be similar to any of those described above.

Figure 9:
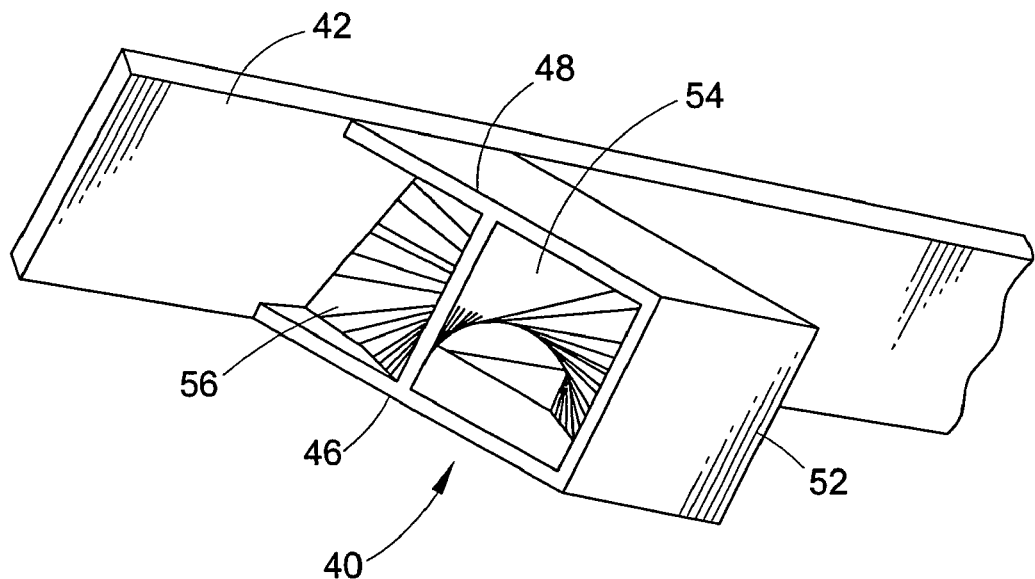
FIG. 9 is an upper perspective schematic view of a diverter attached to a heat sink.
Figure 10:
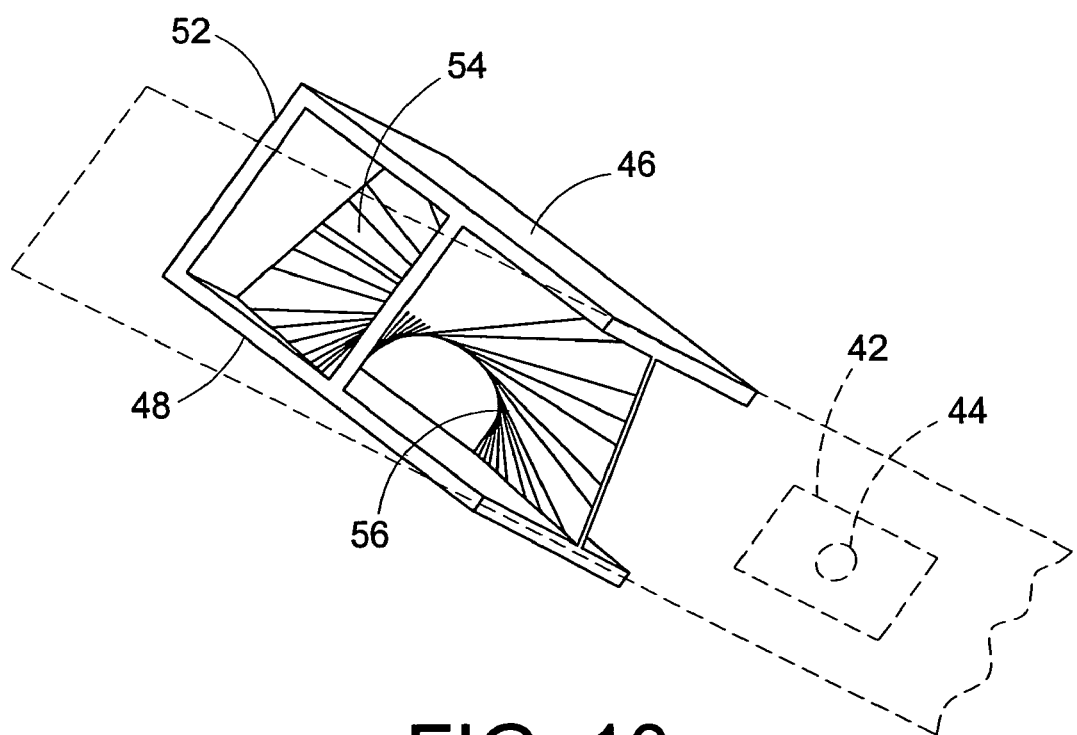
FIG. 10 is a lower perspective schematic view of a diverter attached to a heat sink, with the heat sink and an electrical component shown in phantom.

With reference to FIGS. 9 and 10, another embodiment of a diverter 40 is shown. The diverter 40 attaches to and is in thermal communication with a heat sink 42 that has an electrical component 44 (FIG. 10) mounted to the heat sink, similar to the embodiments disclosed above. The diverter 40 of this embodiment exchanges relatively hot air with cool air by moving outer cooler air toward the heat sink 42 and moving inner hotter air away from the heat sink.

The diverter 40 includes two generally parallel side walls 46 and 48 that are spaced from one another. The side walls 46, 48 extend away from and are generally perpendicular to the heat sink 42. A top or outer wall 52 connects the side walls 46 and 48 and is generally parallel to and spaced from the surface of the heat sink 42 to which the diverter mounts. The top wall 52 and side walls 46, 48 confine air as it moves through the diverter 40.

The diverter 40 also includes an upper or outer wall defining a first curved surface 54 that directs the flow of cooler outer air towards the heat sink 42 and a lower or inner wall that defines a second curved surface 56 that directs the flow of hotter inner air away from the heat sink 42. In this embodiment, the movement of air through the diverter 40 can be described as a 180 degree rotation, in that the cooler outer air is directed to occupy the space that would have been occupied by the hotter inner air and the hotter inner air is directed to occupy the space that would have been occupied by the cooler outer air, had there been no diverter.

The exact shape of the curved walls 54 and 56 is not critical. The curved walls are shown as emanating at a common line at a vertical midpoint between the heat sink 42 and the top wall 52 along the side walls 46 and 48 of the diverter; however, the curved walls can emanate at any location along the side walls. The curve of the curved walls 54 and 56 is simply to encourage the mixing of hot and cold air.

Figure 11:
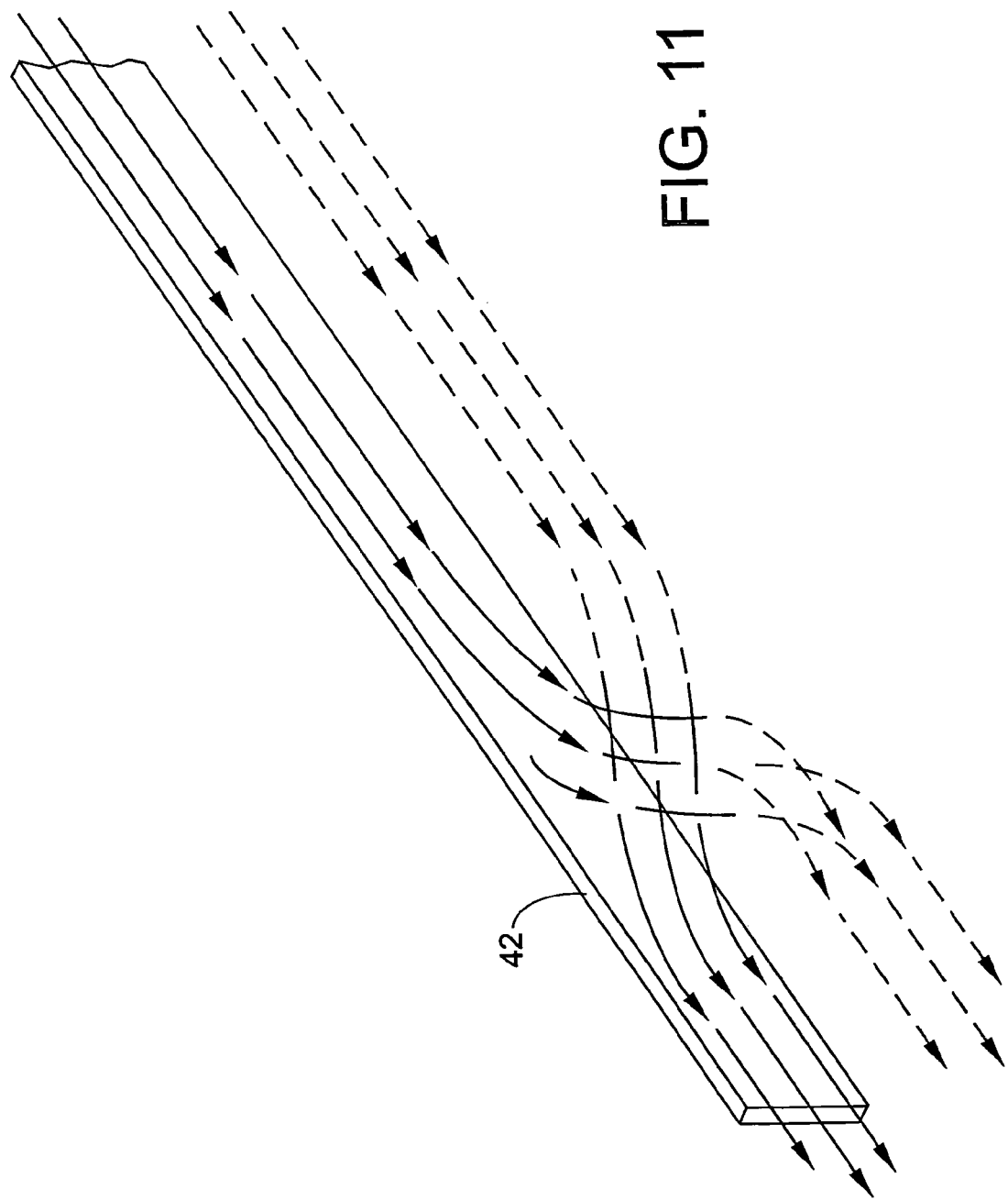
FIG. 11 is a perspective view of a model of airflow through the diverter of FIG. 9.

With reference to FIG. 11, airflow through the diverter (which is not depicted in FIG. 11 for reasons of clarity) is shown. As can be seen, outer air particles that are spaced from the heat sink 42 move toward the heat sink and inner air particles that are spaced adjacent the heat sink move away from the heat sink. The airflow returns to laminar flow downstream from the diverter 40.

It has been found that an appropriately dimensioned heat sink, when appropriate heating is applied, can generate enough air velocity simply via natural convection to incorporate the benefits of providing diverters on the heat sink so that the need for fans, and the like, to promote airflow can be obviated. The heat sink has been described with reference to preferred embodiments; obviously alterations will occur to others upon reading and understanding the detailed description. The invention is not limited to only those embodiments described in the preceding description; the invention is only limited to the appended claims and the equivalents thereof.

The invention claimed is:

1. A heat sink for an electrical component comprising:
   a heat sink body configured to have an associated electrical component mounted to the heat sink body, the body including a heat dissipation surface having a vertical dimension substantially greater than a horizontal dimension; and
   a diverter extending from the heat dissipation surface, the diverter being positioned to disrupt upward vertical airflow that is generated via natural convection over the heat dissipation surface, the diverter being shaped to disrupt the upward vertical airflow that is generated via natural convection to generate turbulent airflow near the heat dissipation surface.

2. The heat sink of claim 1, wherein the diverter is configured to disrupt a laminar regime of the upward vertical airflow.

3. The heat sink of claim 1, wherein the diverter is configured to disrupt a turbulent regime of the upward vertical airflow.

4. The heat sink of claim 1, wherein the diverter is configured to disrupt a transitional regime of the upward vertical airflow.

5. The heat sink of claim 1, wherein the diverter is configured to promote heat transfer across a boundary layer of the upward vertical airflow.

6. The heat sink of claim 1, wherein the diverter is configured to generate an airflow that mixes cooler air disposed away from the heat dissipation surface with hotter air disposed adjacent the heat dissipation surface.

7. The heat sink of claim 1, wherein the vertical dimension is at least about 10 times a first horizontal dimension of the heat dissipation surface.

8. The heat sink of claim 7, wherein the vertical dimension is at least about 10 times a second horizontal dimension of the heat dissipation surface.

9. The heat sink of claim 1, wherein the heat sink body includes a plurality of fins and the diverter is disposed in an area defined between adjacent fins.

10. A device comprising:
   a heat sink including a heat dissipation surface;
   an LED mounted to and in thermal communication with the heat sink, the LED being configured on the heat sink to provide sufficient heat to the heat sink to generate upward airflow via natural convection across the heat dissipation surface; and
   a diverter disposed with respect to the heat sink such that the diverter disrupts the upward airflow that is generated via natural convention across the heat dissipation surface to mix cooler air that is spaced from the heat dissipation surface with hotter air that is adjacent the heat dissipation surface.

11. The device of claim 10, further comprising a plurality of LEDs mounted to and in thermal communication with the heat sink, the LEDs being configured on the heat sink to provide sufficient heat to the heat sink to generate upward airflow via natural convection across the heat dissipation surface.

12. The device of claim 10, wherein the heat sink has a vertical dimension substantially greater than a horizontal dimension.

13. The device of claim 12, wherein the vertical dimension is at least about 10 times a first horizontal dimension of the heat dissipation surface.

14. The heat sink of claim 13, wherein the vertical dimension is at least about 10 times a second horizontal dimension of the heat dissipation surface.

15. A method for cooling an electrical component using natural convection, the method comprising:
   attaching an electrical component to a vertically oriented heat sink including a heat dissipation surface;
   introducing power into the electrical component such that the electrical component heats the heat sink generating upward air flow via natural convection over the heat dissipating surface; and
   absent forced convection, disrupting the upward air flow over the heat dissipating surface to mix cooler air spaced from the heat dissipation surface with hotter air disposed adjacent the heat dissipation surface by passing air over a diverter that extends from the heat dissipation surface.

16. The method of claim 15, wherein the disrupting step further comprises creating turbulent airflow that escapes a boundary layer of the upward air flow.

17. The method of claim 15, wherein the disrupting step further comprises creating turbulent flow adjacent the heat dissipating surface.

18. The method of claim 15, wherein the disrupting step further comprises disrupting the upward air flow in a turbulent regime of the upward air flow.

19. The method of claim 15, wherein the disrupting step further comprises disrupting the upward air flow in a transitional regime of the upward air flow.

20. The method of claim 15, wherein the disrupting step further comprises disrupting the upward air flow in a laminar regime of the upward air flow.

* * * * *